United States Patent
Ameen Beshari et al.

(10) Patent No.: US 11,139,036 B2
(45) Date of Patent: Oct. 5, 2021

(54) USING VARIABLE VOLTAGES TO DISCHARGE ELECTRONS FROM A MEMORY ARRAY DURING VERIFY RECOVERY OPERATIONS

(71) Applicant: INTEL CORPORATION, Santa Clara, CA (US)

(72) Inventors: Tarek Ahmed Ameen Beshari, Santa Clara, CA (US); Pranav Chava, Folsom, CA (US); Shantanu R. Rajwade, Santa Clara, CA (US); Sagar Upadhyay, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/786,948

(22) Filed: Feb. 10, 2020

(65) Prior Publication Data
US 2021/0249092 A1    Aug. 12, 2021

(51) Int. Cl.
  *G11C 16/34*    (2006.01)
  *G11C 16/04*    (2006.01)
  *G11C 16/10*    (2006.01)
  *G11C 16/08*    (2006.01)
  *G11C 16/24*    (2006.01)

(52) U.S. Cl.
  CPC ...... *G11C 16/3427* (2013.01); *G11C 16/0483* (2013.01); *G11C 16/08* (2013.01); *G11C 16/10* (2013.01); *G11C 16/24* (2013.01); *G11C 16/3459* (2013.01)

(58) Field of Classification Search
  CPC ..... G11C 16/3427; G11C 16/10; G11C 16/24; G11C 16/3459; G11C 16/08; G11C 16/0483
  See application file for complete search history.

(56) References Cited

U.S. PATENT DOCUMENTS

| | | | |
|---|---|---|---|
| 9,424,936 B1 | 8/2016 | Tanzawa et al. | |
| 10,176,880 B1 | 1/2019 | Lee | |
| 2001/0040824 A1* | 11/2001 | Banks | G11C 16/3459 365/185.22 |
| 2004/0128594 A1* | 7/2004 | Elmhurst | G11C 29/52 714/718 |
| 2006/0193172 A1* | 8/2006 | Elmhurst | G11C 11/56 365/185.03 |
| 2013/0279263 A1* | 10/2013 | Dong | G11C 16/3468 365/185.19 |

(Continued)

OTHER PUBLICATIONS

Patent Application U.S. Appl. No. 16/396,478, dated Apr. 26, 2019, 30 pp.

(Continued)

*Primary Examiner* — Gene N Auduong
(74) *Attorney, Agent, or Firm* — Compass IP Law PC

(57) ABSTRACT

Provided are an apparatus, memory device, and method for using variable voltages to discharge electrons from a memory array during verify recovery operations. In response to verifying voltages in memory cells of the non-volatile memory array programmed during a programming pulse applying charges to the storage cells, a memory controller concurrently applies voltages on wordlines of the non-volatile memory array to clear the non-volatile memory array of electrons and applies voltages to the bitlines to perform bitline stabilization.

22 Claims, 5 Drawing Sheets

(56) References Cited

U.S. PATENT DOCUMENTS

2015/0078086 A1* 3/2015 Lee .................. G11C 16/08
365/185.11
2018/0247697 A1 8/2018 Lee
2019/0385658 A1 12/2019 Lee

OTHER PUBLICATIONS

Cai, Y., et al., "Read Disturb Errors in MLC NAND Flash Memory", arXiv:1805.03283, May 8, 2018, 12 pp.
Mellor, C., "Gather Round, Kids, and Let's Try to Understand the Science of 3D NAND", [online], Aug. 25, 2017, [Retrieved on Dec. 3, 2019], Retrieved from the Internet at <URL: https://www.theregister.co.uk/2017/08/25/3d_nand_part_1/>, 8 pp.
Micheloni, R., et al., "Architectural and Integration Options for 3D NAND Flash Memories", Computers 2017, 6, 27, Published Aug. 10, 2017, 19 pp.
Schwarz, T., "Flash Memory", [online], [Retrieved on Dec. 3, 2019], Retrieved from the Internet at <URL: http://www.cse.scu.edu/~tschwarz/coen180/LN/flash.html>, 6 pp.
Extended European Search Report for Patent Application No. 20207169.2, dated May 12, 2021, 8 pages.

* cited by examiner

USING VARIABLE VOLTAGES TO DISCHARGE ELECTRONS FROM A MEMORY ARRAY DURING VERIFY RECOVERY OPERATIONS

TECHNICAL FIELD

Embodiments described herein generally relate to an apparatus, non-volatile memory storage device and method for using variable voltages to discharge electrons from a memory array during verify recovery operations.

BACKGROUND

Solid state storage devices (for example, solid state drives or SSDs) may be comprised of one or more packages of non-volatile memory dies implementing NAND memory cells, where each die is comprised of storage cells, where storage cells are organized into pages and pages are organized into blocks. Each storage cell can store one or more bits of information. The different cells may be programmed to one or more voltages by applying a series of pulses to have selected cells reach a desired voltage level.

In NAND memory arrays, a sequence of pulses is applied to selected memory cells to inject an amount of charges in the memory cells. Each pulse is followed by a series of verifies to check that each cell has trapped the desired amount of charges. Once a cell has passed the verify corresponding to the desired programming level for the cell, that cell is inhibited from additional charge injections in the following pulses. After the sequence of verifies of a certain pulse is concluded, preparing for the next pulse involves a series of array cleaning operations to discharge electrons from the array to prevent effective channel boosting loss and undesired hot carrier injection on cells that are to be inhibited.

There is a need in the art for improved techniques for performing the verify recovery operation to discharge elections from the array.

BRIEF DESCRIPTION OF THE DRAWINGS

Embodiments are described by way of example, with reference to the accompanying drawings, which are not drawn to scale, in which like reference numerals refer to similar elements.

DESCRIPTION OF EMBODIMENTS

Figure 1:
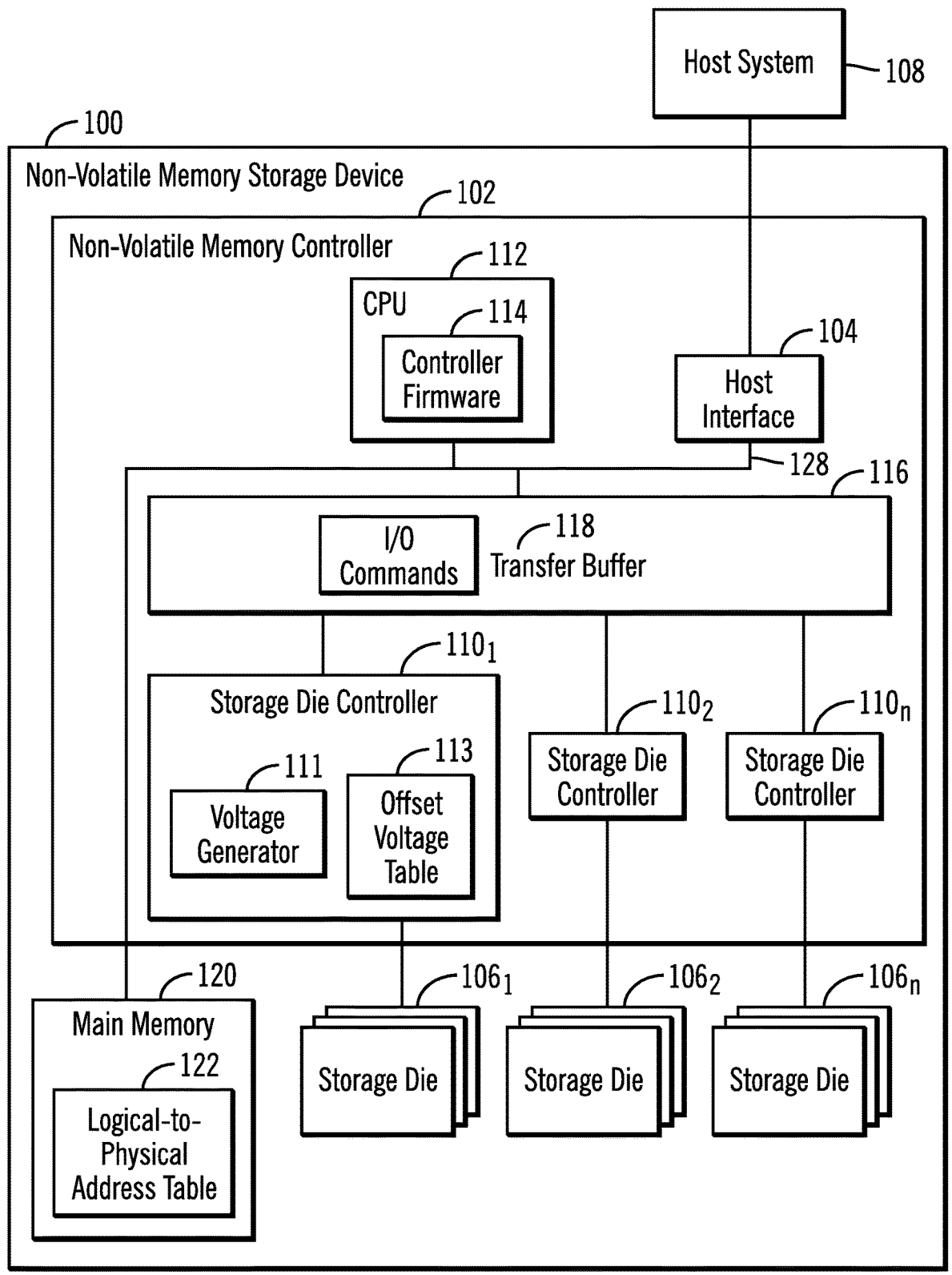
FIG. 1 illustrates an embodiment of a non-volatile memory storage device.

In certain verify recovery implementations, after verifying the voltages in the memory cells to which electrons were injected, preparing for the next pulse involves a series of array cleaning operations to prevent effective channel boosting loss and undesired hot carrier injection on cells that are to be inhibited. This cleaning may also be followed by array seeding to equalize the potential in the array. Finally, a bitline separation and elaboration is performed, in which bitlines are used to individually either enable or disable additional charge trapping/programming on various cells.

The cleaning operation to discharge electrons from the memory cells is to clear electrons that can cause issues in subsequent array operations. For example, these electrons trapped in the channel can move to the neighboring program voltage ($V_{pgm}$) wordline during a next program (pgm) pulse and degrade the boosting window. A degraded boosting window can cause program disturb or the inadvertent programming of a memory cell. In one example, program disturb results in the mis-programming of a memory cell level with Fowler-Nordheim tunneling due to an overabundance of electrons in the channel of a memory cell being programmed or inhibited.

The preparation for a next pulse operation to further program cells required to be programmed to a higher voltage level involves three phases that occur sequentially, a verify recovery, seeding, and bitline separation and stabilization. During the verify recovery phase the memory array is cleaned from electron puddles in the array that would result in undesired charge injection of inhibited cells in the next pulse. This phase may involve applying an intermediate passing voltage on the array or staggering the potential from a passing voltage to the ground across the array, or any part of the array, one wordline after another including the selected wordline to discharge the electron puddles. During the seeding phase, the entire array is grounded or taken to a low voltage and then only the select wordline and select gates are taken to a passing voltage while the pillar is biased to allow a bit of electrons in. The purpose of this is to make sure the pillar is not at a negative voltage due to the possible excessive cleaning from verify recovery. The negative voltage may cause hot carrier injection in the next pulse. During the bitline separation and stabilization phase, the outcome of the verifies is processed and cells that should be inhibited are known and they are added to the inhibit pool. Selected bitlines and inhibited bitlines are taken to the destination voltages (ground or supply) and given time to stabilize to make sure inhibited bitlines have reached the supply voltage ($V_{cc}$) and the select junction is shut down.

The above implementation of the verify recovery operation into three consecutive phases can take considerable time, especially during a staggered discharge operation as the number of wordlines increase in ever denser arrays and during the bitline separation and stabilization phase as the number and length of the bitlines increases in ever denser arrays.

Described embodiments provide improvements to the technology of the verify recovery phase by eliminating the seeding phase and performing the discharge operation and bitline separation and stabilization processes in parallel. With the described embodiments, all the needed array preparations for the next pulse are performed in parallel as efficient as possible while leaving the array at the end of the pulse preparation phase in a state to reduce the following pulse duration. Described embodiments provide for pulse preparation time reduction and ending the verify recovery phase in an optimum state for the next pulse. With respect to the pulse preparation time reduction, once the sequence of verifies is concluded, the information regarding which bitlines are to be inhibited and which ones are to be programmed becomes available. The time limit on the verify recovery phase, also referred to as pulse preparation operations is determined by the time needed to charge and stabilize the signals on various both wordlines and bitlines to inhibit or programming voltages $\tau \propto RC$.

With the described embodiments, array cleaning and preparation for the next pulse is done in parallel to bitline charging and the verify recovery phase, i.e., pulse preparation time, should complete by the time bitlines have stabilized. The described embodiments further ensure the array is in an optimum ending state before the next pulse for both reliability and performance concerns. For reliability concerns, the array channels should properly be cleaned from any charge puddles that may cause undesired charge injection to the inhibited cells in the next pulse. The selected wordline is taken to a prime voltage=$(V_{pgm}-V_{pass})$ minus an offset for the group of wordlines. The prime voltage is adjusted and differs for the group of lines. The offset voltages for different groups of wordlines are set to optimize the discharge of electrons from the array while applying lower voltages for certain groups of wordlines to retain different numbers of electrons at different wordlines in the array to avoid undesired carrier injection and high electrostatic fields. By the end of the array cleaning, the selected word line is taken to a prime voltage, which is adjusted by an offset. The choice of this voltage is to help reduce the ramping time for the programming pulse.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage device electronic assemblies. Embodiments include both devices and methods for forming electronic assemblies.

FIG. 1 illustrates an embodiment of a non-volatile memory storage device 100 having a non-volatile memory controller 102, including a host interface 104 to transfer blocks of data and I/O commands between a plurality of groups of storage dies 106$_1$, 106$_2$ . . . 106$_n$, comprising a non-volatile memory of storage cells that may be organized into pages of storage cells, where the pages are organized into blocks, and a connected host system 108. The non-volatile memory storage device 100 includes storage die controllers 110$_1$, 110$_2$ . . . 110$_n$ that manage read and write requests to blocks of data in pages of storage cells to groups of the storage dies 106$_1$, 106$_2$ . . . 106$_n$ and the transfer of data between the transfer buffer 116 and the storage dies 106$_1$, 106$_2$ . . . 106$_n$. The storage die controllers 110$_1$, 110$_2$ . . . 110$_n$ may include, as shown with respect to storage die controller 110$_1$, a voltage generator 111 to generate voltages and an offset voltage table 113 providing different offset voltages for different groups of wordlines in memory arrays formed in the storage dies 106$_1$, 106$_2$ . . . 106 to use when discharging electrons from the memory arrays during a verify recovery operation.

A storage die 110$_i$ may cause the voltage generator 111 to generate different voltages to apply to wordlines, bitlines, and other components, such as select gate drain (SGD) devices, and select gate source (SGS) devices, during read or write operations to access memory cells, to perform erase operations, and to perform verify recovery operations to prepare the memory array for a next round of pulses of program voltages ($V_{pgm}$) to further program selected memory cells to a next program level.

The non-volatile memory storage device 100 may function as both a memory device and/or a storage device (for example, a Solid State Drive (SSD)) in a computing system, and may be used to perform the role of volatile memory devices and non-volatile storage media in a computing system. In an embodiment, the non-volatile memory storage device 100 may comprise a non-volatile memory storage device.

The non-volatile memory controller 102 may include a central processing unit (CPU) 112 implementing controller firmware 114, also referred to as a memory controller, managing the operations of the non-volatile memory storage device 100 and a non-volatile transfer buffer 116 comprising a non-volatile memory device to cache and buffer transferred Input/Output ("I/O") commands 118 and data between the host 108 and storage dies 106$_1$, 106$_2$ . . . 106$_n$. The transfer buffer 116 may comprise a Static Random Access Memory (SRAM) or other suitable volatile or non-volatile memory storage device.

A main memory 120 stores a logical-to-physical address table 122 providing a mapping of logical addresses to which I/O requests are directed and physical addresses in the storage dies 106$_1$, 106$_2$ . . . 106$_n$ at which the data for the logical addresses are stored The logical addresses may comprise logical block address (LBAs) or other logical addresses known in the art.

In one embodiment, the memory device, such as including the storage dies 106$_1$, 106$_2$ . . . 106$_n$, transfer buffer 116, and main memory 120, may comprise a block addressable memory device, such as those based on NAND or NOR technologies. A memory device may also include future generation nonvolatile devices, such as a three dimensional crosspoint (3D crosspoint) memory device, or other byte addressable write-in-place nonvolatile memory devices. In some embodiments, 3D crosspoint memory may comprise a transistor-less stackable cross point architecture in which memory cells sit at the intersection of wordlines and bitlines and are individually addressable and in which bit storage is based on a change in bulk resistance. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. The storage dies 106$_1$, 106$_2$ . . . 106$_n$, transfer buffer 116, and main memory 120 may comprise different types of memory devices. The transfer buffer 116 may comprise an SRAM; and the main memory 120 may comprise a Dynamic Random Access Memory (DRAM), which may be battery backed-up, or a 3D crosspoint memory. In certain embodiments, the main memory 120 may comprise a non-volatile memory storage device 100 of the described embodiments within another non-volatile memory storage device 100.

The host interface 104 connects the non-volatile memory storage device 100 to a host system 108. The non-volatile memory storage device 100 may be installed or embedded within the host system 108, such as shown and described with respect to element 1108 or 1110 in FIG. 11, or the non-volatile memory storage device 100 may be external to the host system. The host interface 104 may comprise a bus interface, such as a Peripheral Component Interconnect Express (PCIe) interface, Serial AT Attachment (SATA), Non-Volatile Memory Express (NVMe), etc.

The CPU 112, host interface 104, and transfer buffer 116 may communicate over one or more bus interfaces 128, such as a PCIe or other type of bus or interface. Data may be transferred among the host interface 104, CPU 112, and transfer buffer 116 over the bus 128 using Direct Memory Access (DMA) transfers, which bypass the CPU 112. Alternatively, the CPU 112 may be involved in transferring data among the host interface 104, transfer buffer 116, and storage dies $106_1$, $106_2$ . . . $106_n$ over the bus 128. In FIG. 1, the connection between the units is shown as a bus 128. In alternative embodiments the connection among any of the components 104, 112, 116, and 120 may comprise direct lines or paths and not a shared bus.

Figure 2:
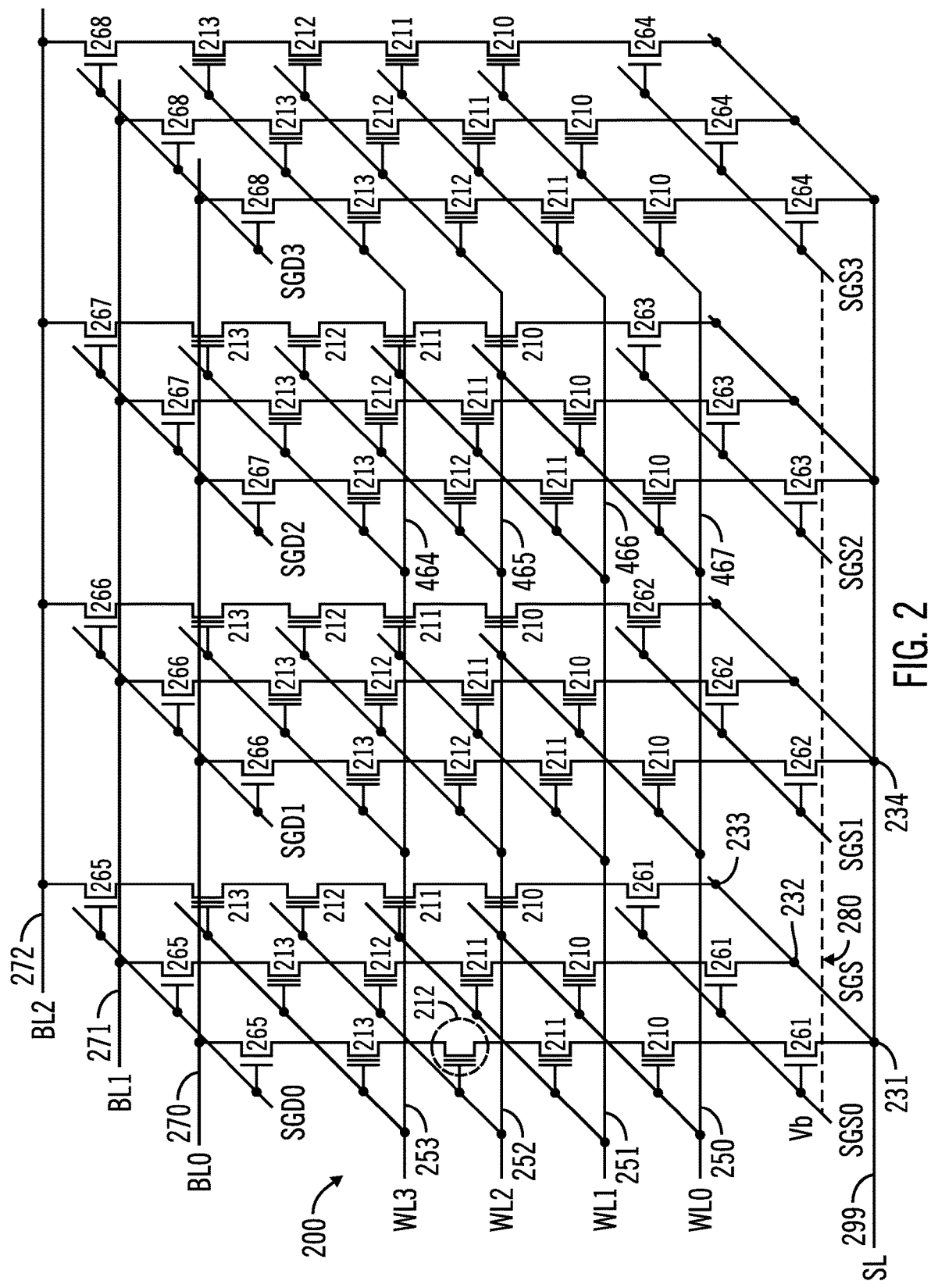
FIG. 2 illustrates an embodiment of a memory array.

FIG. 2 is an embodiment of a 3D memory array 200 that may be implemented in the storage dies storage dies $106_1$, $106_2$ . . . $106_n$, where there may be one or more of the memory arrays 200 implemented in each of the storage dies $106_1$, $106_2$ . . . $106_n$. The memory array includes wordlines 250, 251, 252, and 253 that carry corresponding signals WL0, WL1, WL2, and WL3 and data lines (bitlines) 270, 271, and 272 that carry signals BL0, BL1, and BL2, respectively. Four wordlines 250, 251, 252, and 253 and three bitlines 270, 271, and 272 are shown in FIG. 2 as an illustrative example only. The number of these lines may vary. Memory device 200 may include memory cells 210, 211, 212, and 213, and transistors 261 through 268. The memory cells 210, 211, 212, and 213 and transistors 261 through 268 may be arranged in memory cell strings, such as memory cell strings (pillars) 231, 232, and 233. For simplicity, in FIG. 2, only three of the memory cell strings (pillars) are labeled (231, 232, and 233). The memory array 200 shown in FIG. 2 includes nine memory cell strings and four memory cells 210, 211, 212, and 213 in each memory cell string (pillar).

The example memory array 202 shown in FIG. 2 is provided for illustrative purposes and is not limiting to this disclosure. One skilled in the art will appreciate that the number of access lines, number of memory cell strings (pillars), and number of memory cells in each memory cell string may vary.

Memory cells 210, 211, 212, and 213 may be physically located in multiple levels of the memory array 200, memory device 200, such that memory cells 210, 211, 212, and 213 in the same memory cell string may be stacked over each other in multiple levels of memory device 200, forming a pillar. As shown in FIG. 2, transistors 261 through 268 and may be controlled (e.g., turned on or turned off) by corresponding signals SGD0, SGD1, SGD2, and SGD3, and SGS0, SGS1, SGS2, and SGS3 provided via corresponding lines as shown to couple the memory cell strings to their respective bitlines 270, 271, and 272, and a line 299, during a memory operation, such as a write operation. In some embodiments, depending on a desired memory array 200 configuration, the lines carrying signals SGS0, SGS1, SGS2, and SGS3 may be connected via a common SGS line 280, as shown.

Source line (SL) 299 may include a common source line of memory device 200 and may carry a signal, such as signal SL. In a memory operation, such as a write operation, different voltages may be applied to lines 250, 251, 252, and 253 by the voltage generator 111 to selectively access memory cells 210, 211, 212, and 213 in order to store information into one or more selected memory cell among memory cells 210, 211, 212, and 213. For example, in a write operation, memory device 200 may select memory cell 212 (shown within a dashed circle) of memory cell string 231 to store information into memory cell 212. In this example, memory device 200 may apply a voltage to line 252 and other voltages to lines 250, 251, and 253. The voltage on lines 250, 251, and 253 may have the same or different values.

In embodiments, the memory array 200 may comprise one or more memory blocks disposed in the storage dies $106_1$, $106_2$ . . . $106_n$. A memory block may have different memory capacities, depending on technological demand. For simplicity purposes, the memory array 200 illustrated in FIG. 2 illustrates a memory block that includes four sub-blocks defined respectively by SGD0, SGD1, SGD2, and SGD3. In operation, such as when a memory array is to be accessed for programming (or data reading), a memory block may be selected (e.g., for programming) or deselected, in order to refrain from programming while other block(s) are being programmed. Accordingly, in a memory array having a plurality of memory blocks, at least one block may be selected for access (e.g., for a program mode or read mode), while other blocks may be deselected in order to refrain from access. Selection and deselection of memory blocks may be accomplished by application of particular voltage values to respective wordlines and SGS lines.

The offset voltage table 113 may specify different voltage offsets to use for different groups of wordlines 250, 251, 252, and 253 that are used to determine the discharge voltage to apply to a group of wordlines to discharge electrons during the verify recovery phrase. The offset voltages may be determined empirically during development of the memory device to determine the amount of discharge voltage that minimizes undesired carrier injection and high electrostatic fields that remain in the memory array 200 after the verify recover phase that negatively impact pulse generation operations to program the memory cells.

In some examples, each memory cell 210, 211, 212, 213 can be programmed according to various encoding schemes such as SLC (single level cell), MLC (multi-level cell) TLC (triple level cell), QLC (quad level cell), or other encoding scheme. Each cell's threshold voltage (Vt) is indicative of the data that is stored in the cell.

A programming sequence for a group of cells may include programming all of the intended pages into the group of cells. A programming sequence may include one or more programming passes. A programming pass (which may include one or more programming loops) may program one or more pages. A programming pass may include the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming). The application of an effective program voltage ($V_{pgm}$) to a cell may include changing the voltage difference between a control gate and a channel of the cell in order to change the threshold voltage of the cell. Accordingly, a voltage of a wordline 250, 251, 252, 253 (coupled to the control gate of the target cell) and/or a channel of the cell may be set in order to effectuate application of an effective program voltage. As a program voltage is commonly used to refer to a voltage applied to a wordline, the effective program voltage can be the voltage difference between a control gate and channel of a cell (which in instances where the channel is held at 0 V can be synonymous with a program voltage).

Figure 3:
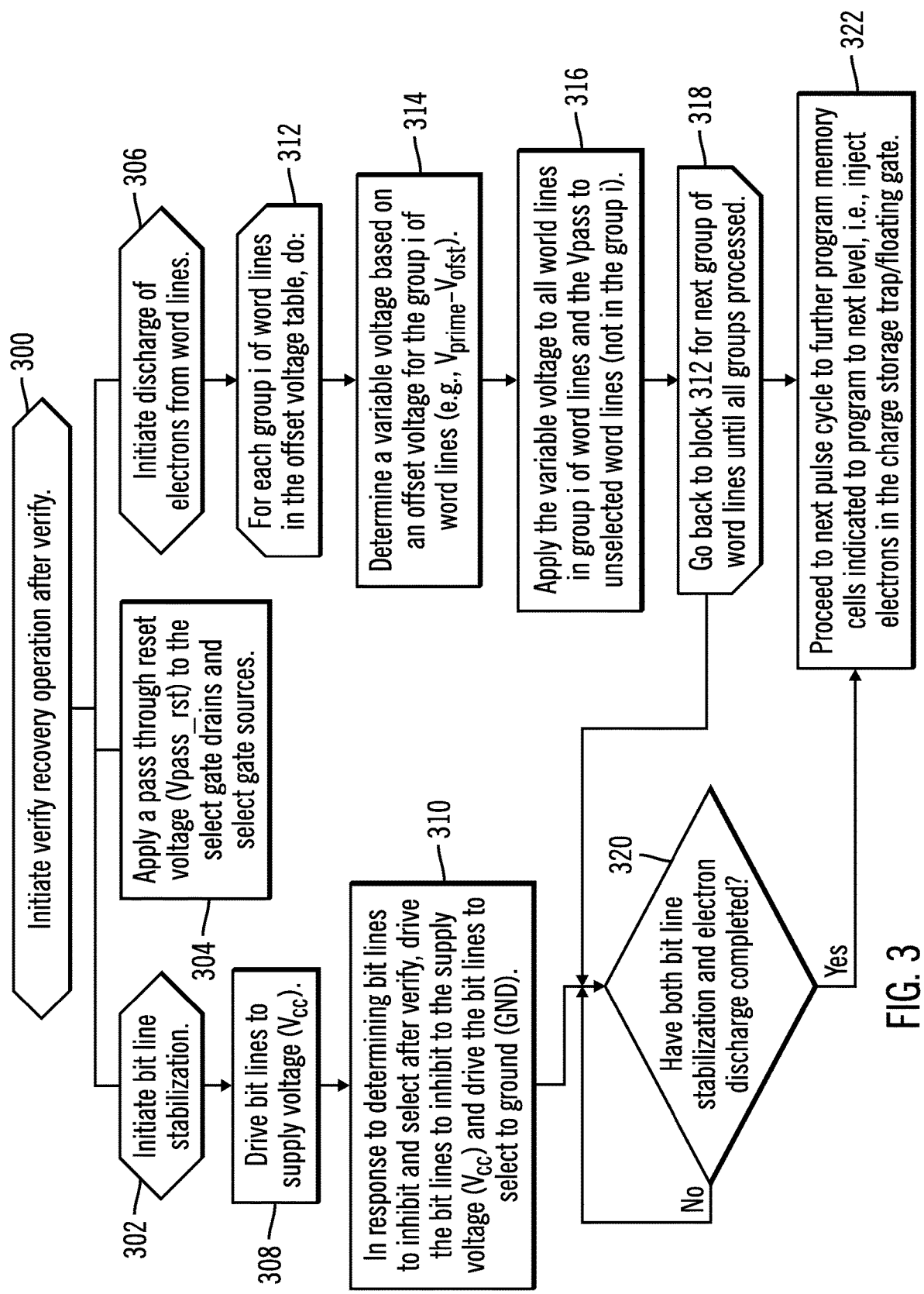
FIG. 3 illustrates an embodiment of operations to perform the verify recovery operation to prepare the memory array for a next pulse programming operations.

FIG. 3 illustrates an embodiment of operations performed by a storage die controller $110_1$, such as one of storage die controllers $110_1, 110_2 \ldots 110_n$, after verify operations to determine if each storage cell has reached its desired programming level or needs further charge injection. Once a cell reaches a desired level, the bitline is used to inhibit any additional programming of this cell by shutting down the bitline to select gate junction. The operations of FIG. 3 are performed as part of the verify recovery operation to prepare the array 200 for a next program pulse phase. Upon initiating (at block 300) a verify recovery operation after the verify operation, the storage die controller $110_i$ will in parallel initiate (at block 302) bitline 270, 271, 272 stabilization, control the voltage generator 111 to apply (at block 304) a pass through reset voltage ($V_{pass\_rst}$) to the select gate drains SGD0, SGD1, SGD2, SGD3 and select gate sources SGS0, SGS1, SGS2, SGS3, and initiate (at block 306) the discharge of electrons from the wordlines 250, 251, 252, 253.

To initiate electron discharge operations, a loop of operations is performed at blocks 312 through 318 for each group i of the groups of wordlines indicated in the offset voltage table 113, e.g., some group of consecutive wordlines 250, 251, 252, 253 in the array 200. The storage die controller $110_i$ determines (at block 314) a variable voltage based on the prime voltage tunable by an offset voltage for the group i of wordlines indicated in the offset voltage table 113. In one embodiment, the variable voltage may be calculated as $V_{prime}-V_{ofst}$, where Vprime is the prime voltage and $V_{ofst}$ is the offset voltage from the offset voltage table 113 used to vary the voltage to apply to discharge electrons from wordlines. The storage die controller $106_i$ controls the voltage generator 111 to apply (at block 316) the determined variable voltage to all world lines in group i of wordlines and control the voltage generator 111 to apply the pass through voltage ($V_{pass}$) to unselected wordlines (not in the group i). With this embodiment, the variable voltage applied to a group of wordlines to clear comprises the prime voltage adjusted by the offset voltage ($V_{ofst}$), such that the group of wordlines is taken to the variable voltage before being taken to ground to clean. In one embodiment, the prime voltage may comprise $V_{pgm}-V_{pass}$, where $V_{pgm}$ is a program voltage and $V_{pass}$ is a pass through voltage.

Upon initiating (at block 302) bitline stabilization, the storage die controller $110_i$ controls the voltage generator 111 to drive (at block 308) the bitlines 270, 271, 272 to a supply voltage ($V_{cc}$). In response to determining (at block 310) the bitlines to inhibit and select after verify, the voltage generator 111 is controlled to drive the bitlines to inhibit to the supply voltage ($V_{cc}$) and drive the bitlines to select to ground (GND).

After both the bitline stabilization and the electron discharge operations at blocks 310 and 320, respectively, are completed (at block 320), the storage die controller $110_i$ proceeds (at block 322) to the next pulse cycle to further program memory cells indicated to program to a next level, i.e., inject electrons in the charge storage trap/floating gate.

With the embodiment of FIG. 3, the electron seeding step is eliminated and staggered discharge is better optimized by varying the voltage for different groups of wordlines to fully prepare the array for the next pulse. Further, staggered discharge and bitline stabilization are performed in parallel to save time. Bitlines 270, 271, 272 are driven to supply voltage $V_{cc}$ at the beginning of the disclosed sequence. As soon as the inhibit information is elaborated, bitlines 270, 271, 272 are driven to their desired voltage ($V_{cc}$ for inhibit and GND for select bitlines). The selected wordlines in the group are then taken to the variable voltage, the primary voltage ($V_{pgm}-V_{pass}$) adjusted by a tunable offset $V_{ofst}$ from the offset voltage table 113.

Figure 4:
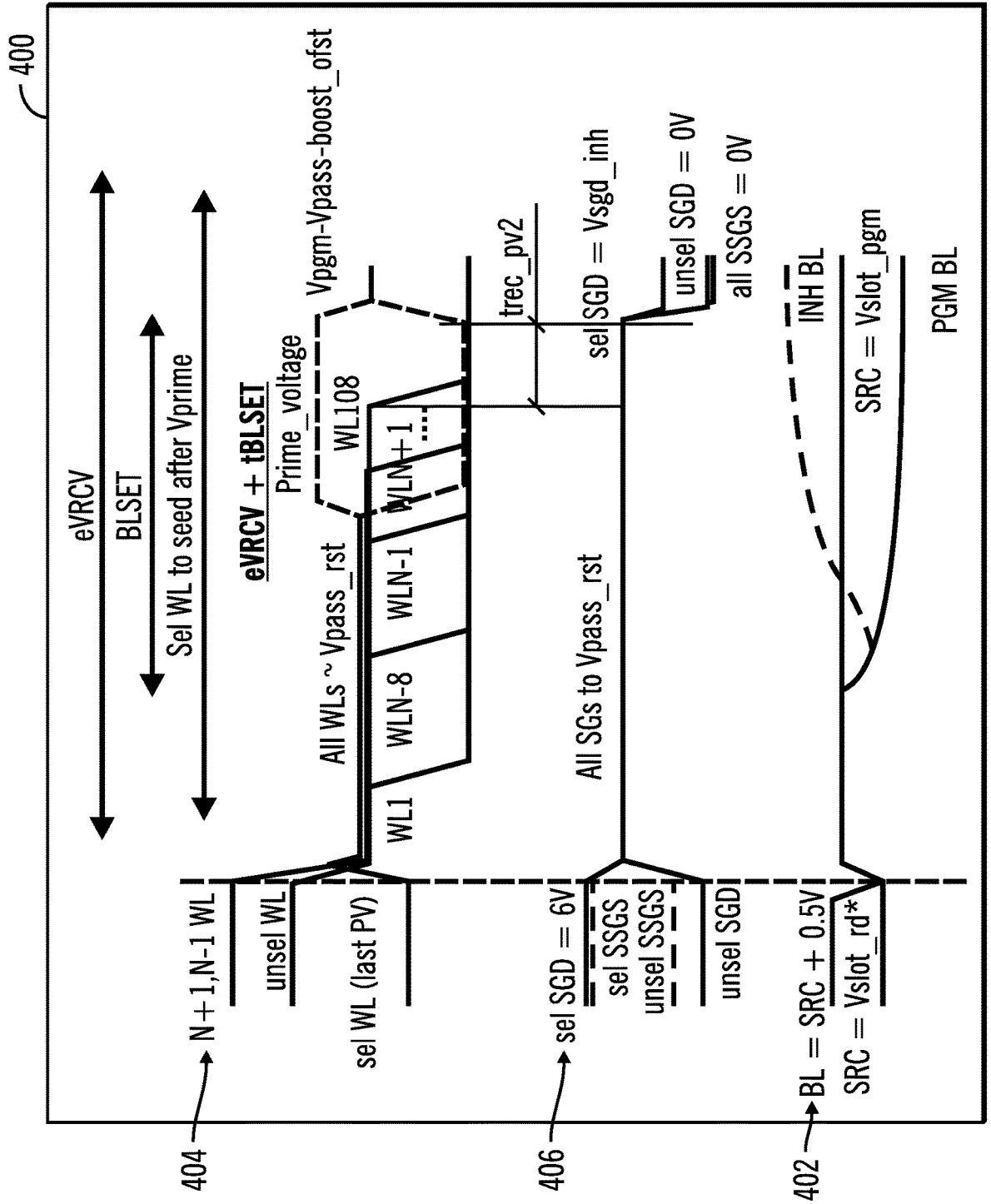
FIG. 4 illustrates a timing chart showing the operations of FIG. 3 performed in parallel.

In certain embodiments, the above described voltages may have the following ranges of values:

Vpgm→15V~25V
Vpass→7V~11V
$V_{cc}$→2V~3V
$V_{pass\_rst}$→4V~6V
Vprime or Prime_voltage→0V~7V
$V_{ofst}$ (Seeding_ofst)→0V~5V
SRC→~2V
Vslot_pgm→~2V
trec_pv2→4 0~5 us FIG. 4 illustrates a timing diagram 400 of how the three operations to stabilize the bitlines 402, stagger discharge the electrons 404, and to apply a pass through reset voltage to the select gate drains and select gate sources 406 are performed in parallel to save time in performing these verify recovery operations to prepare for the next programming pulse. FIG. 4 includes the following abbreviations:

Vprime—prime voltage
BLSET—Bitline set
eVRCV—efficient verify recovery
WL—wordline
Unsel WL—unselected wordline
Sel SGD—selected select gate drain device
Sel SSGS—selected select gate source device
unsel SGD—unselected select gate drain device
unsel SSGS—sunelected select gate source device
SRC—source plate voltage, its value may change depending on the performed operation in the array.
Vslot_pgm—the source voltage during programming.
trec_pv2—the delay between taking the last wordline to ground in the array and the SGD for the array cleaning.
Vsgd_inh—voltage to inhibit the SGD device
INH BL—Voltage to inhibit the bitline.
PGM BL—voltage to program the bitline The fundamental limit on reducing the duration of the pulse preparation operations is a function of the time needed to charge and stabilize the signals on the bitlines 270, 271, 272 to inhibit or drive to programming voltages τ∝RC. Parallelizing the array cleaning with the bitline stabilization time allows for utilizing the time during which stabilization is performed to perform the more sophisticated staggered discharge operations with almost no penalty to the programming time. In this way, the electron discharge using variable voltages minimizes undesired carrier injection in the next pulse and leaves the array in its best condition with no added penalty to programming. Moreover, the selected wordline is kept at the variable prime voltage ($V_{prime}-V_{ofst}$), that helps reduce the pulse ramping time.

Figure 5:
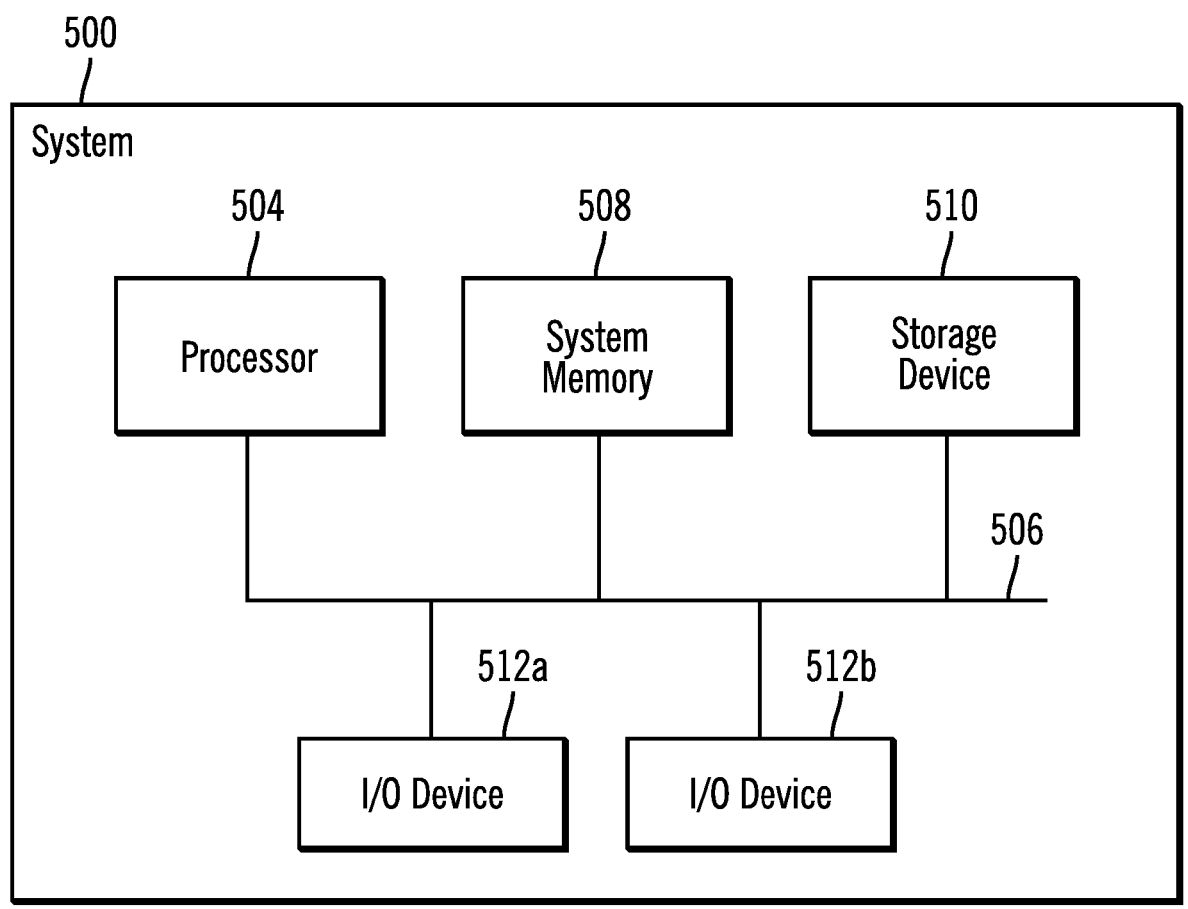
FIG. 5 illustrates an embodiment of a system in which the memory device of FIG. 1 may be deployed.

FIG. 5 illustrates an embodiment of a system 500 in which the non-volatile memory storage device 100 of FIG. 1 may be deployed as the system memory device 508 and/or a storage device 510. The system 500 includes a processor 504 that communicates over a bus 506 with a system memory device 508 in which programs, operands and parameters being executed are cached, and a storage device 510, which may comprise a solid state drive (SSD) that stores programs and user data that may be loaded into the system memory 508 for execution. The processor 504 may also communicate with Input/Output (I/O) devices 512a, 512b, which may comprise input devices (e.g., keyboard, touchscreen, mouse, etc.), display devices, graphics cards, ports, network interfaces, etc. The memory 508 and storage device 510 may be coupled to an interface on the system 500 motherboard, mounted on the system 500 motherboard, or deployed in an external memory device or accessible over a network.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

The reference characters used herein, such as i and n, etc., are used to denote a variable number of instances of an element, which may represent the same or different values, and may represent the same or different value when used with different or the same elements in different described instances.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

EXAMPLES

The following examples pertain to further embodiments.

Example 1 is an apparatus for preparing a non-volatile memory array comprised of wordlines and bitlines coupled to storage cells for application of pulses to the storage cells to program the storage cells, comprising a memory controller. In response to verifying voltages in memory cells of the non-volatile memory array programmed during a programming pulse applying charges to the storage cells, the memory controller concurrently performs apply voltages on wordlines of the non-volatile memory array to clear the non-volatile memory array of electrons and apply voltages to the bitlines to perform bitline stabilization.

In Example 2, the subject matter of Examples 1 and 3-9 can optionally include that to apply the voltages on the wordlines comprises a staggered discharge that applies variable voltages to different groups of wordlines to cause different amounts of electrons to remain at storage cells coupled to the different groups of wordlines to avoid electrostatic high fields within the non-volatile memory array.

In Example 3, the subject matter of Examples 1, 2, and 4-9 can optionally include that when applying a variable voltage to a group of wordlines, the memory controller is further to apply a pass-through reset voltage to worldlines not in the group of wordlines to which the variable voltage is applied.

In Example 4, the subject matter of Examples 1-3 and 5-9 can optionally include that the memory controller maintains an offset voltage for each group of wordlines, wherein different offset voltages are maintained for different of the groups of wordlines. The memory controller is further to perform, for each group of the groups of wordlines to discharge, determine a variable voltage for the group of wordlines based on the offset voltage for the group of wordlines being discharged, wherein the determined variable voltage is applied to each of the wordlines in the group of wordlines to discharge electrons from the storage cells coupled to the wordlines in the group.

In Example 5, the subject matter of Examples 1-4 and 6-9 can optionally include that to determine variable voltage for each of the group of wordlines based on the offset voltage comprises a prime voltage minus the offset voltage for the group of wordlines.

In Example 6, the subject matter of Examples 1-5 and 7-9 can optionally include that the prime voltage comprises a program voltage minus a pass through voltage.

In Example 7, the subject matter of Examples 1-6, 8, and 9 can optionally include that to apply the voltages to the bitlines to perform bitline stabilization while applying voltages to the wordlines to discharge electrons comprises: drive the bitlines to a supply voltage; and in response to determining bitlines to inhibit and select while driving the bitlines to the supply voltage, drive the bitlines to inhibit to the supply voltage and drive the bitlines to select to ground.

In Example 8, the subject matter of Examples 1-7 and 9 can optionally include that the memory controller is further to apply a pass through reset voltage to select gate drains and select gate sources coupled to strings of storage cells in the non-volatile memory array, through which the wordlines pass, concurrently while applying voltages to the bitlines and the wordlines.

In Example 9, the subject matter of Examples 1-8 can optionally include that the non-volatile memory array comprises a three dimensional array of NAND storage cells.

Example 10 is memory device, comprising a memory array comprised of wordlines and bitlines coupled to storage cells for application of pulses to the storage cells to program the storage cells and a memory controller. In response to verifying voltages in memory cells of the non-volatile memory array programmed during a programming pulse applying charges to the storage cells, the memory controller concurrently performs apply voltages on wordlines of the non-volatile memory array to clear the non-volatile memory array of electrons and apply voltages to the bitlines to perform bitline stabilization.

In Example 11, the subject matter of Examples 10 and 12-17 can optionally include that to apply the voltages on the wordlines comprises a staggered discharge that applies variable voltages to different groups of wordlines to cause different amounts of electrons to remain at storage cells coupled to the different groups of wordlines to avoid electrostatic high fields within the non-volatile memory array.

In Example 12, the subject matter of Examples 10, 11 and 13-17 can optionally include that when applying a variable voltage to a group of wordlines, the memory controller is further to apply a pass-through reset voltage to worldlines not in the group of wordlines to which the variable voltage is applied.

In Example 13, the subject matter of Examples 10-12 and 14-17 can optionally include that the memory controller maintains an offset voltage for each group of wordlines, wherein different offset voltages are maintained for different of the groups of wordlines. The memory controller is further to perform, for each group of the groups of wordlines to discharge, determine a variable voltage for the group of wordlines based on the offset voltage for the group of wordlines being discharged, wherein the determined variable voltage is applied to each of the wordlines in the group of wordlines to discharge electrons from the storage cells coupled to the wordlines in the group.

In Example 14, the subject matter of Examples 10-13 and 15-17 can optionally include that to determine variable voltage for each of the group of wordlines based on the offset voltage comprises a prime voltage minus the offset voltage for the group of wordlines.

In Example 15, the subject matter of Examples 10-14, 16, and 17 can optionally include that the prime voltage comprises a program voltage minus a pass through voltage.

In Example 16, the subject matter of Examples 10-15 and 17 can optionally include that to apply the voltages to the bitlines to perform bitline stabilization while applying voltages to the wordlines to discharge electrons comprises: drive the bitlines to a supply voltage; and in response to determining bitlines to inhibit and select while driving the bitlines to the supply voltage, drive the bitlines to inhibit to the supply voltage and drive the bitlines to select to ground.

In Example 17, the subject matter of Examples 10-16 can optionally include that the memory controller is further to apply a pass through reset voltage to select gate drains and select gate sources coupled to strings of storage cells in the non-volatile memory array, through which the wordlines pass, concurrently while applying voltages to the bitlines and the wordlines.

Example 18 is a method for preparing a non-volatile memory array comprised of wordlines and bitlines coupled to storage cells for application of pulses to the storage cells to program the storage cells. In response to verifying voltages in memory cells of the non-volatile memory array programmed during a programming pulse applying charges to the storage cells, concurrently performing: applying voltages on wordlines of the non-volatile memory array to clear the non-volatile memory array of electrons and applying voltages to the bitlines to perform bitline stabilization.

In Example 19, the subject matter of Examples 18 and 20-25 can optionally include that the applying the voltages on the wordlines comprises a staggered discharge that applies variable voltages to different groups of wordlines to cause different amounts of electrons to remain at storage cells coupled to the different groups of wordlines to avoid electrostatic high fields within the non-volatile memory array.

In Example 20, the subject matter of Examples 18, 19 and 21-25 can optionally include that when applying a variable voltage to a group of wordlines, the memory controller is further to apply a pass-through reset voltage to worldlines not in the group of wordlines to which the variable voltage is applied.

In Example 21, the subject matter of Examples 18-20 and 22-25 can optionally include that the memory controller maintains an offset voltage for each group of wordlines, wherein different offset voltages are maintained for different of the groups of wordlines. For each group of the groups of wordlines to discharge, a determination is made of a variable voltage for the group of wordlines based on the offset voltage for the group of wordlines being discharged, wherein the determined variable voltage is applied to each of the wordlines in the group of wordlines to discharge electrons from the storage cells coupled to the wordlines in the group.

In Example 22, the subject matter of Examples 18-21 and 23-25 can optionally include that the determined variable voltage for each of the group of wordlines based on the offset voltage comprises a prime voltage minus the offset voltage for the group of wordlines.

In Example 23, the subject matter of Examples 18-22, 24, and 25 can optionally include that the prime voltage comprises a program voltage minus a pass through voltage.

In Example 24, the subject matter of Examples 18 and 20-25 can optionally include that the applying the voltages to the bitlines to perform bitline stabilization while applying voltages to the wordlines to discharge electrons comprises: driving the bitlines to a supply voltage; and in response to determining bitlines to inhibit and select while driving the bitlines to the supply voltage, driving the bitlines to inhibit to the supply voltage and drive the bitlines to select to ground.

In Example 25, the subject matter of Examples 18-24 can optionally include applying a pass through reset voltage to select gate drains and select gate sources coupled to strings of storage cells in the non-volatile memory array, through which the wordlines pass, concurrently while applying voltages to the bitlines and the wordlines.

What is claimed is:

1. An apparatus for preparing a non-volatile memory array comprised of wordlines and bitlines coupled to storage cells for application of pulses to the storage cells to program the storage cells, comprising:
   a memory controller to:
     in response to verifying voltages in memory cells of the non-volatile memory array programmed during a programming pulse applying charges to the storage cells, concurrently to:
       apply voltages on wordlines of the non-volatile memory array to clear the non-volatile memory array of electrons that includes a staggered discharge that applies variable voltages to different groups of wordlines to cause different amounts of electrons to remain at storage cells coupled to the different groups of wordlines to avoid electrostatic high fields within the non-volatile memory array; and
       apply voltages to the bitlines to perform bitline stabilization.

2. The apparatus of claim 1, wherein when applying a variable voltage to a group of wordlines, the memory controller is further to apply a pass-through reset voltage to worldlines not in the group of wordlines to which the variable voltage is applied.

3. The apparatus of claim 1, wherein the memory controller maintains an offset voltage for each group of wordlines, wherein different offset voltages are maintained for different of the groups of wordlines, wherein the memory controller is further to perform for each group of the groups of wordlines to discharge:
   determine a variable voltage for the group of wordlines based on the offset voltage for the group of wordlines being discharged, wherein the determined variable voltage is applied to each of the wordlines in the group of wordlines to discharge electrons from the storage cells coupled to the wordlines in the group.

4. The apparatus of claim 3, wherein to determine variable voltage for each of the group of wordlines based on the offset voltage comprises a prime voltage minus the offset voltage for the group of wordlines.

5. The apparatus of claim 4, wherein the prime voltage comprises a program voltage minus a pass through voltage.

6. The apparatus of claim 1, wherein to apply the voltages to the bitlines to perform bitline stabilization while applying voltages to the wordlines to discharge electrons comprises:
   drive the bitlines to a supply voltage; and
   in response to determining bitlines to inhibit and select while driving the bitlines to the supply voltage, drive the bitlines to inhibit to the supply voltage and drive the bitlines to select to ground.

7. The apparatus of claim 1, wherein the memory controller is further to:
   apply a pass through reset voltage to select gate drains and select gate sources coupled to strings of storage cells in the non-volatile memory array, through which the wordlines pass, concurrently while applying voltages to the bitlines and the wordlines.

8. The apparatus of claim 1, wherein the non-volatile memory array comprises a three dimensional array of NAND storage cells.

9. A memory device, comprising:
   a non-volatile memory array comprised of wordlines and bitlines coupled to storage cells for application of pulses to the storage cells to program the storage cells; and
   a memory controller to:
      in response to verifying voltages in memory cells of the non-volatile memory array programmed during a programming pulse applying charges to the storage cells, concurrently to:
      apply voltages on wordlines of the non-volatile memory array to clear the non-volatile memory array of electrons that includes a staggered discharge that applies variable voltages to different groups of wordlines to cause different amounts of electrons to remain at storage cells coupled to the different groups of wordlines to avoid electrostatic high fields within the non-volatile memory array; and
      apply voltages to the bitlines to perform bitline stabilization.

10. The memory device of claim 9, wherein when applying a variable voltage to a group of wordlines, the memory controller is further to apply a pass-through reset voltage to worldlines not in the group of wordlines to which the variable voltage is applied.

11. The memory device of claim 9, wherein the memory controller maintains an offset voltage for each group of wordlines, wherein different offset voltages are maintained for different of the groups of wordlines, wherein the memory controller is further to perform for each group of the groups of wordlines to discharge:
   determine a variable voltage for the group of wordlines based on the offset voltage for the group of wordlines being discharged, wherein the determined variable voltage is applied to each of the wordlines in the group of wordlines to discharge electrons from the storage cells coupled to the wordlines in the group.

12. The memory device of claim 11, wherein to determine variable voltage for each of the group of wordlines based on the offset voltage comprises a prime voltage minus the offset voltage for the group of wordlines.

13. The memory device of claim 12, wherein the prime voltage comprises a program voltage minus a pass through voltage.

14. The memory device of claim 9, wherein to apply the voltages to the bitlines to perform bitline stabilization while applying voltages to the wordlines to discharge electrons comprises:
   drive the bitlines to a supply voltage; and
   in response to determining bitlines to inhibit and select while driving the bitlines to the supply voltage, drive the bitlines to inhibit to the supply voltage and drive the bitlines to select to ground.

15. The memory device of claim 9, wherein the memory controller is further to:
   apply a pass through reset voltage to select gate drains and select gate sources coupled to strings of storage cells in the non-volatile memory array, through which the wordlines pass, concurrently while applying voltages to the bitlines and the wordlines.

16. A method for preparing a non-volatile memory array comprised of wordlines and bitlines coupled to storage cells for application of pulses to the storage cells to program the storage cells, comprising:
   in response to verifying voltages in memory cells of the non-volatile memory array programmed during a programming pulse applying charges to the storage cells, concurrently:
      applying voltages on wordlines of the non-volatile memory array to clear the non-volatile memory array of electrons that includes a staggered discharge that applies variable voltages to different groups of wordlines to cause different amounts of electrons to remain at storage cells coupled to the different groups of wordlines to avoid electrostatic high fields within the non-volatile memory array; and
      applying voltages to the bitlines to perform bitline stabilization.

17. The method of claim 16, wherein applying a variable voltage to a group of wordlines, further includes applying a pass-through reset voltage to worldlines not in the group of wordlines to which the variable voltage is applied.

18. The method of claim 16, furthering comprising:
   maintaining an offset voltage for each group of wordlines, wherein different offset voltages are maintained for different of the groups of wordlines, further performing for each group of the groups of wordlines to discharge; and
   determining a variable voltage for the group of wordlines based on the offset voltage for the group of wordlines being discharged, wherein the determined variable voltage is applied to each of the wordlines in the group of wordlines to discharge electrons from the storage cells coupled to the wordlines in the group.

19. The method of claim 18, wherein the determined variable voltage for each of the group of wordlines based on the offset voltage comprises a prime voltage minus the offset voltage for the group of wordlines.

20. The method of claim 19, wherein the prime voltage comprises a program voltage minus a pass through voltage.

21. The method of claim 16, wherein the applying the voltages to the bitlines to perform bitline stabilization while applying voltages to the wordlines to discharge electrons comprises:
   driving the bitlines to a supply voltage; and
   in response to determining bitlines to inhibit and select while driving the bitlines to the supply voltage, driving the bitlines to inhibit to the supply voltage and drive the bitlines to select to ground.

22. The method of claim 16, further comprising:
   applying a pass through reset voltage to select gate drains and select gate sources coupled to strings of storage cells in the non-volatile memory array, through which the wordlines pass, concurrently while applying voltages to the bitlines and the wordlines.

* * * * *